(12) United States Patent
Singh

(10) Patent No.: US 10,998,917 B1
(45) Date of Patent: May 4, 2021

(54) SIGMA-DELTA ANALOG-TO-DIGITAL CONVERTER

(71) Applicant: NXP B.V., Eindhoven (NL)

(72) Inventor: Kamlesh Singh, Bengaluru (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/929,084

(22) Filed: Jul. 14, 2020

(51) Int. Cl.
*H03M 3/00* (2006.01)

(52) U.S. Cl.
CPC .............. *H03M 3/492* (2013.01); *H03M 3/37* (2013.01); *H03M 3/49* (2013.01); *H03M 3/504* (2013.01)

(58) Field of Classification Search
CPC .......... H03M 3/492; H03M 3/37; H03M 3/49; H03M 3/504
USPC .......................................... 341/143, 144, 155
See application file for complete search history.

(56) References Cited

U.S. PATENT DOCUMENTS

| 7,446,686 B2 | 11/2008 | Rueger et al. | |
| 2018/0109268 A1* | 4/2018 | Kong | H03H 19/004 |

OTHER PUBLICATIONS

Mokhtar, M. et al. "A 94.3-dB SFDR, 91.5-dB DR, and 200-kS/s CT Incremental Delta-Sigma Modulator With Differentially Reset FIR Feedback", IEEE Solid-State Circuits Letters, vol. 2, No. 9, pp. 87-90 (Sep. 2019).

* cited by examiner

*Primary Examiner* — Peguy Jean Pierre
(74) *Attorney, Agent, or Firm* — Rajeev Madnawat

(57) ABSTRACT

A sigma-delta analog-to-digital converter (ADC) includes a feed-forward circuit, a finite-impulse-response (FIR) digital-to-analog converter (DAC), and a decimation filter. The feed-forward circuit is configured to receive an analog input signal and a feedback signal and generate a set of digital signals. Each feedback element of the FIR DAC includes a flip-flop and a reset circuit. The reset circuit is configured to receive a corresponding reset signal of a set of reset signals and output a reference output signal when the corresponding reset signal is deactivated. The reset signal of each feedback element is deactivated sequentially after each cycle of a clock signal that is received by the flip-flop associated with a corresponding reset circuit of each feedback element. The feedback signal is generated based on the reference output signal. The decimation filter is configured to generate a digital output signal based on the set of digital signals.

20 Claims, 8 Drawing Sheets

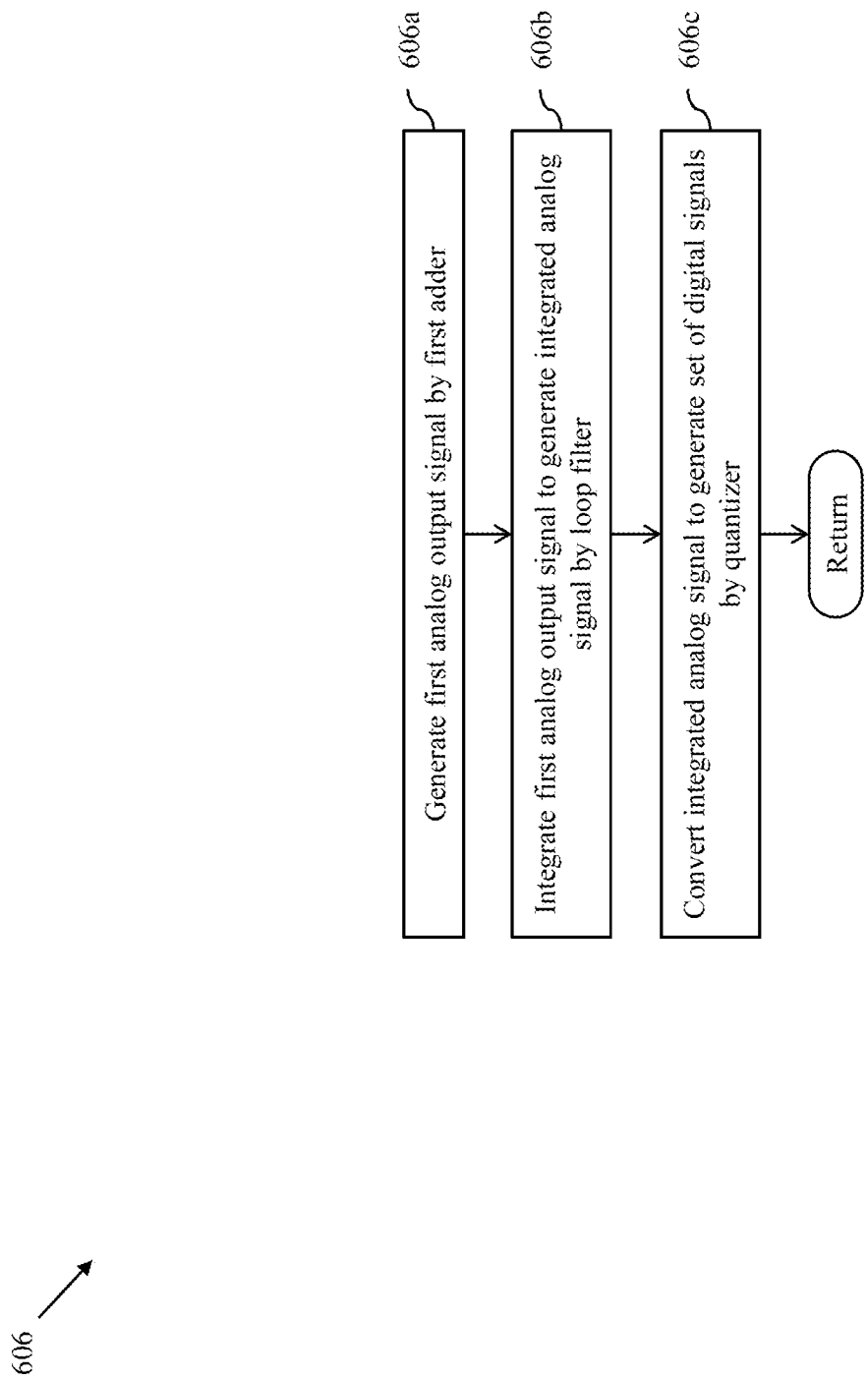

SIGMA-DELTA ANALOG-TO-DIGITAL CONVERTER

BACKGROUND

The present disclosure relates generally to electronic circuits, and, more particularly, to analog-to-digital converters.

An analog-to-digital converter (ADC) converts an analog input signal to a digital output signal. A sigma-delta ADC is a type of ADC that utilizes sigma-delta modulation technique to convert the analog input signal to the digital output signal. An incremental sigma-delta ADC is a type of sigma-delta ADC that is reset periodically, and includes a number of integrator stages that is equal to an order of the incremental sigma-delta ADC. The incremental sigma-delta ADC farther includes a finite-impulse-response (FIR) digital-to-analog converter (DAC) that includes an arrangement of flip-flops as feedback elements, and is implemented in the incremental sigma-delta ADC to relax slew rate and settling time requirements associated with the integrator stages. However, as the incremental sigma-delta ADC is reset periodically, the flip-flops of the FIR DAC are initialized with fixed values, such as all '1's or all '0's, or alternate '1's and '0's, due to which a systematic offset is introduced in the digital output signal of the incremental sigma-delta ADC. A presence of the systematic offset in the digital output signal reduces a dynamic range and an accuracy of the incremental-sigma delta ADC.

A solution to reduce the systematic offset is to implement a chopping technique by initializing the flip-flops with a set of values in one conversion cycle to convert the analog input signal to the digital output signal and with a reverse polarity of the values in another conversion cycle. However, the chopping technique reduces a data rate of the incremental sigma-delta ADC by half which reduces a speed of operation of the incremental sigma-delta ADC. Thus, there is a need for a technical solution that solves the aforementioned problems of the conventional incremental sigma-delta ADC.

SUMMARY

In one embodiment, a sigma-delta analog-to-digital converter (ADC) is disclosed. The sigma-delta ADC includes a feed-forward circuit, a first finite-impulse-response (FIR) digital-to-analog converter (DAC), and a decimation filter. The feed-forward circuit is configured to receive a set of analog signals and a refresh signal, and generate a set of digital signals. The set of analog signals includes an analog input signal and a feedback signal. The first FIR DAC is coupled with the feed-forward circuit, and configured to receive the set of digital signals and a clock signal, and generate the feedback signal. The first FIR DAC comprises a set of feedback elements. Each feedback element includes a flip-flop and a reset circuit. The flip-flop is configured to receive a first input signal and generate a set of flop-output signals. The first input signal is based on the set of digital signals. The reset circuit is coupled with the flip-flop, and configured to receive a set of reference signals, the set of flop-output signals, and a corresponding reset signal of a set of reset signals, and output a reference output signal based on the corresponding reset signal. The reset circuit of each feedback element is configured to output the reference output signal sequentially after each cycle of the clock signal. The feedback signal is generated based on the reference output signal. The decimation filter is coupled with the feed-forward circuit, and configured to receive the set of digital signals and the refresh signal, and generate a digital output signal.

In another embodiment, a method of generating a digital output signal by a sigma-delta analog-to-digital converter (ADC) is disclosed. The sigma-delta ADC includes a feed-forward circuit, a first finite-impulse-response (FIR) digital-to-analog converter (DAC), and a decimation filter. The method comprises receiving, by the feed-forward circuit, a set of analog signals and a refresh signal, and generating, by the feed-forward circuit, a set of digital signals. The set of analog signals includes an analog input signal and a feedback signal. The method further comprises receiving, by a set of feedback elements of the FIR DAC, a first input signal, a clock signal, a set of reference signals, and a set of reset signals. The first input signal is based on the set of digital signals. The method further comprises outputting, by each feedback element, a reference output signal sequentially after each cycle of the clock signal based on a corresponding reset signal of the set of reset signals. The reference output signal is at least one of first and second reference signals of the set of reference signals. The feedback signal is generated based on the reference output signal. The method further comprises receiving, by the decimation filter, the set of digital signals and the refresh signal, and generating, by the decimation filter, the digital output signal based on the set of digital signals.

In some examples, the feed-forward circuit comprises a first adder that is configured to receive the analog input signal and the feedback signal, and generate a first analog output signal.

In some examples, the feed-forward circuit further comprises a loop filter that is coupled with the first adder, and configured to receive the first analog output signal, a compensation signal, and the refresh signal, and generate an integrated analog signal. The set of analog signals further includes the compensation signal.

In some examples, the loop filter includes first through third integrators, a first gain stage, and a second adder. The first integrator is coupled with the first adder, and configured to receive the first analog output signal and the refresh signal, integrate the first analog output signal, and generate a second analog output signal. The first gain stage is coupled with the first integrator, and configured to receive the second analog output signal and generate a third analog output signal. The second integrator is coupled with the first integrator, and configured to receive the second analog output signal and the refresh signal, integrate the second analog output signal, and generate a fourth analog output signal. The second adder is coupled with the first gain stage and the second integrator, and configured to receive the third analog output signal, the fourth analog output signal, and the compensation signal, and generate a fifth analog output signal. The third integrator is coupled with the second adder, and configured to receive the fifth analog output signal and the refresh signal, integrate the fifth analog output signal, and generate the integrated analog signal. The first through third integrators generate the second analog output signal, the fourth analog output signal, and the integrated analog signal, respectively, when the refresh signal is deactivated.

In some examples, the feed-forward circuit further comprises a quantizer that is coupled with the loop filter, and configured to receive the integrated analog signal and generate the set of digital signals.

In some examples, the sigma-delta ADC further includes a second FIR DAC and a control circuit. The second FIR DAC is coupled with the quantizer and the loop filter, and configured to receive the set of digital signals, the clock signal, the set of reset signals, and the set of reference signals, and generate the compensation signal. The control circuit is coupled with the loop filter, the first FIR DAC, the decimation filter, and the second FIR DAC, and configured to generate the clock signal, the set of reference signals, the refresh signal, and the set of reset signals such that each reset signal is deactivated sequentially after each cycle of the clock signal.

In some examples, the first FIR DAC further comprises first and second switches. The first switch is coupled with the feed-forward circuit, and configured to receive a first digital signal of the set of digital signals, and a first reference signal of the set of reference signals, and output the first reference signal when the first digital signal is activated. The first digital signal is a single-bit digital signal. The second switch is coupled with the feed-forward circuit, and configured to receive a second digital signal of the set of digital signals and a second reference signal of the set of reference signals, and output the second reference signal when the second digital signal is activated. The second digital signal is an inverted version of the first digital signal. The second digital signal is a single-bit digital signal.

In some examples, the first FIR DAC further comprises a third adder that is coupled with the first and second switches and the set of feedback elements, and configured to receive the first and second reference signals when the first and second switches are activated, respectively, and the reference output signal from the reset circuit of each feedback element, and generate a sixth analog output signal.

In some examples, the first FIR DAC further comprises a second gain stage that is coupled with the third adder, and configured to receive the sixth analog output signal and generate the feedback signal.

In some examples, the first input signal is at least one of a first digital signal of the set of digital signals and a corresponding flop-output signal of a previous feedback element of the set of feedback elements.

In some examples, the reset circuit comprises first through third logic gates and third and fourth switches. The first logic gate is configured to receive the corresponding reset signal and generate an inverted reset signal. The second logic gate is coupled with the flip-flop and the first logic gate, and configured to receive a first flop-output signal of the set of flop-output signals and the inverted reset signal and generate a first logic signal. The third switch is coupled with the second logic gate, and configured to receive the first logic signal and a first reference signal of the set of reference signals, and output the first reference signal as the reference output signal when the first logic signal is activated. The third logic gate is coupled with the flip-flop and the first logic gate, and configured to receive a second flop-output signal of the set of flop-output signals and the inverted reset signal and generate a second logic signal. The second flop-output signal is an inverted version of the first flop-output signal. The fourth switch is coupled with the third logic gate, and configured to receive the second logic signal and a second reference signal of the set of reference signals, and output the second reference signal as the reference output signal when the second logic signal is activated.

In some examples, the set of reset signals includes first through Nth reset signals. The refresh signal and the set of reset signals are activated at a start of a first cycle of the clock signal, the refresh signal is deactivated at an end of the first cycle, and the first through Nth reset signals are deactivated at an end of second through (N+1)th cycles of the clock signal, respectively.

In some examples, the first FIR DAC is a single-bit FIR DAC. The digital output signal is a multi-bit digital signal.

In some examples, the sigma-delta ADC is an incremental sigma-delta ADC. An order of the sigma-delta ADC is at least three.

Various embodiments of the present disclosure disclose a sigma-delta analog-to-digital converter (ADC) for generating a digital output signal. The sigma-delta ADC includes a feed-forward circuit, a first finite-impulse-response (FIR) digital-to-analog converter (DAC), and a decimation filter to convert an analog input signal to a digital output signal. The feed-forward circuit is configured to receive a set of analog signals and generate a set of digital signals. The set of analog signals includes the analog input signal and a feedback signal. The first FIR DAC is configured to receive the set of digital signals and generate the feedback signal, and includes a set of feedback elements. Each feedback element includes a flip-flop and a reset circuit, and receives a corresponding reset signal of a set of reset signals such that each feedback element is reset when the corresponding reset signal is deactivated. Each feedback element provides feedback, i.e., outputs a reference output signal, when the corresponding reset signal is deactivated. Each reset signal is deactivated sequentially after each cycle of the clock signal. The feedback signal is generated based on the reference output signal outputted by each feedback element. The decimation filter is configured to receive the set of digital signals and a refresh signal, and generate the digital output signal.

The sigma-delta ADC is reset by the refresh signal periodically. Further, each feedback element of the set of feedback elements of the first FIR DAC are reset by a corresponding reset signal of the set of reset signals as compared to a global reset signal, i.e., the refresh signal, such that each reset signal is deactivated sequentially after each cycle of the clock signal. Thus, each feedback element provides feedback sequentially after each cycle of the clock signal due to which an initial state of the flip-flop of each feedback element does not affect the generation of the digital output signal, and a systematic offset in the digital output signal is eliminated. Further, the incremental sigma-delta ADC generates the digital output signal after each conversion cycle. Thus, a data rate of the incremental sigma-delta ADC is high as compared to the conventional incremental sigma-delta ADC that implements a chopping technique. As the data rate of the incremental sigma-delta ADC is high, a speed of operation of the incremental sigma-delta. ADC is high. Additionally, the incremental sigma-delta ADC does not require calibration for eliminating the systematic offset.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

FIGS. 6A-6C, collectively, represent a flow chart that illustrates a method for generating a digital output signal by the sigma-delta. ADC of FIG. 2 in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
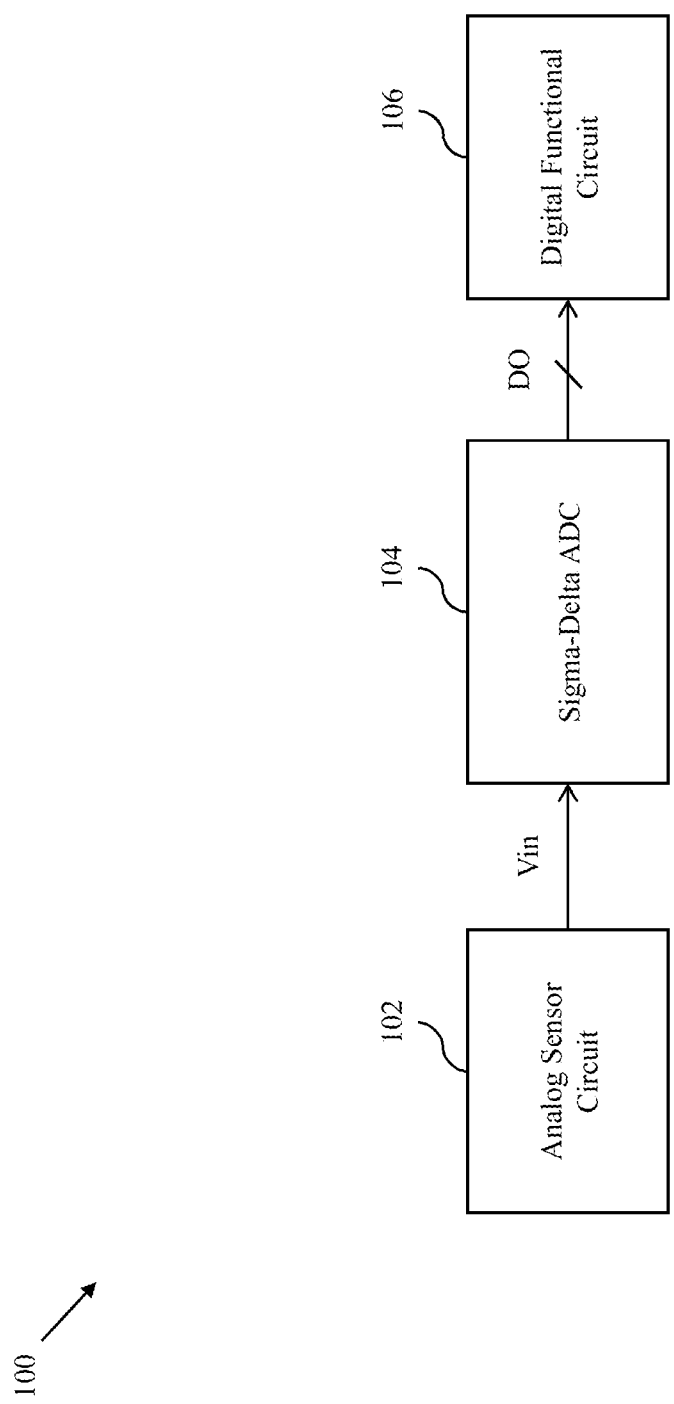
FIG. 1 is a block diagram of a system-on-chip (SoC) in accordance with an embodiment of the present disclosure.

Referring now to FIG. 1, a block diagram of a system-on-chip (SoC) 100 in accordance with an embodiment of the present disclosure is shown. The SoC 100 includes an analog sensor circuit 102, a sigma-delta analog-to-digital converter (ADC) 104, and a digital functional circuit 106.

The analog sensor circuit 102 may be any analog circuitry including an analog sensor (not shown) that generates an analog input signal Vin. The analog input signal Vin is indicative of a test signal, a functional signal, or the like. In one example, the analog sensor circuit 102 is implemented by utilizing a temperature sensor (not shown) that is configured to detect a temperature and generate the analog input signal Vin based on the detected temperature. In another example, the analog sensor circuit 102 is implemented by utilizing multiple sensors (not shown) of a multi-channel data acquisition system (not shown).

The sigma-delta ADC 104 is coupled with the analog sensor circuit 102, and configured to receive the analog input signal Vin. The sigma-delta ADC 104 is an incremental sigma-delta ADC that is reset periodically to perform digital conversion of the analog input signal Vin to generate a digital output signal DO. The digital output signal DO is a multi-bit digital signal, i.e., an N-bit digital signal. The digital output signal DO is generated in 'M' cycles of a clock signal that is generated by the sigma-delta ADC 104. The clock signal is shown later in FIG. 2. An order of the sigma-delta ADC 104 is at least three. In presently preferred embodiment, the sigma-delta ADC 104 is a third order incremental sigma-delta ADC. In one example, the digital output signal DO is a 13-bit signal and is generated in '64' cycles of the clock signal.

It will be apparent to a person skilled in the art that although in the presently preferred embodiment, the sigma-delta ADC 104 is a third order incremental sigma-delta ADC, in an alternate embodiment, the sigma-delta ADC 104 may be any higher order incremental sigma-delta ADC where the order is greater than three. In one example, the sigma-delta ADC 104 is a continuous-time sigma-delta ADC. In another example, the sigma-delta ADC 104 is a discrete-time sigma-delta ADC.

The digital functional circuit 106 is coupled with the sigma-delta ADC 104, and configured to receive the digital output signal DO. The digital functional circuit 106 may be any digital circuitry that receives the digital output signal DO and performs operations related to display, testing, or the like. In one example, the digital functional circuit 106 is implemented by utilizing a display circuit (not shown) that is configured to receive the digital output signal DO as an input and display a digital value corresponding to the digital output signal DO on a display screen (not shown).

Figure 2:
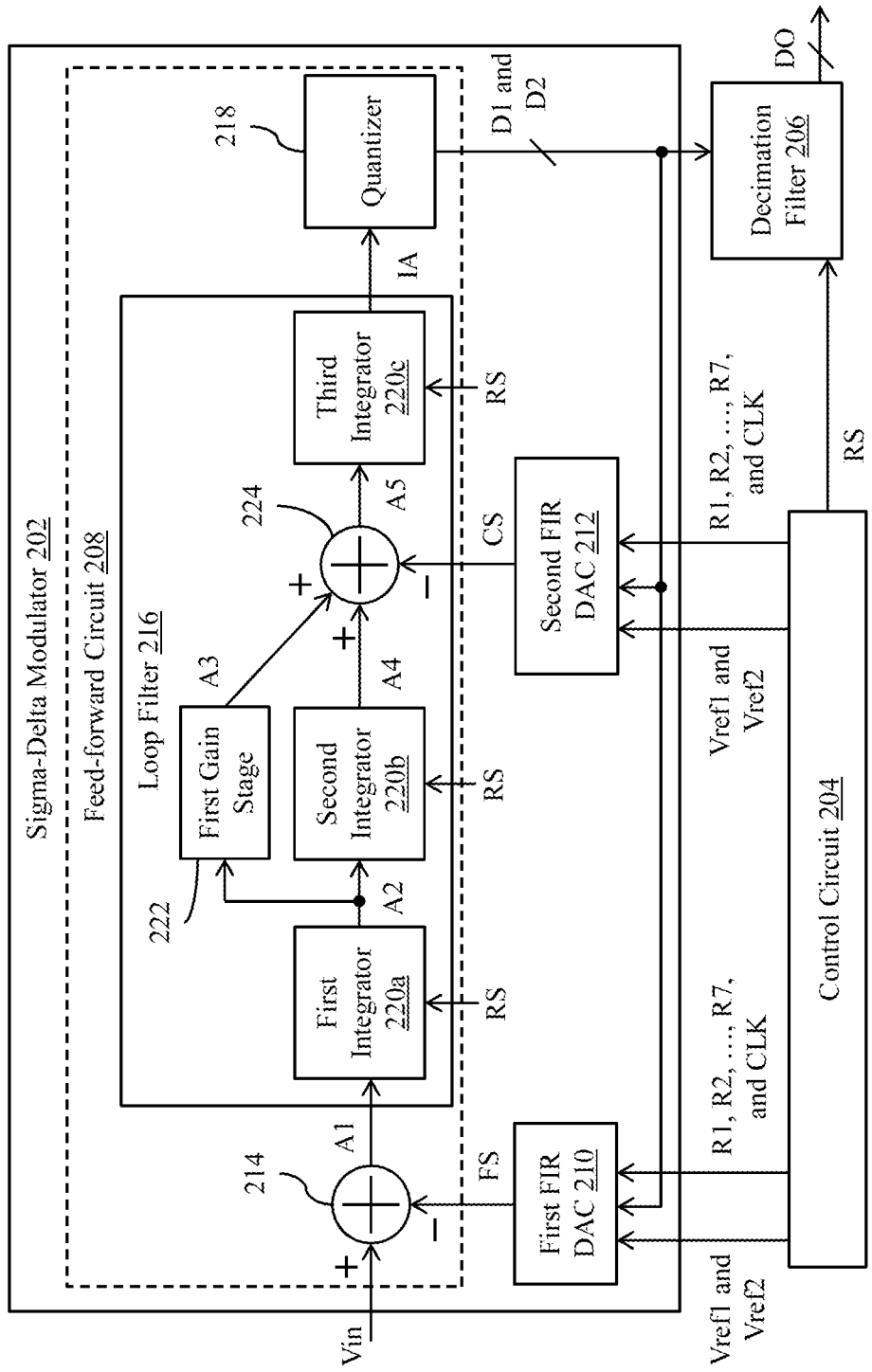
FIG. 2 is a block diagram of a sigma-delta analog-to-digital converter (ADC) of the SoC of FIG. 1 in accordance with an embodiment of the present disclosure.

Referring now to FIG. 2, a block diagram of the sigma-delta ADC 104 in accordance with an embodiment of the present disclosure is shown. The sigma-delta ADC 104 includes a sigma-delta modulator 202, a control circuit 204, and a decimation filter 206.

The sigma-delta modulator 202 is coupled with the analog sensor circuit 102, and configured to receive the analog input signal Vin, implement a sigma-delta modulation technique to modulate, i.e., convert, the analog input signal Vin, and generate a set of digital signals. The set of digital signals includes first and second digital signals D1 and D2. The first and second digital signals D1 and D2 are single-bit digital signals. The second digital signal D2 is an inverted version of the first digital signal D1. The sigma-delta modulator 202 includes a feed-forward circuit 208, a first finite-impulse-response (FIR) digital-to-analog converter (DAC) 210, and a second FIR DAC 212.

The feed-forward circuit 208 is coupled with the analog sensor circuit 102, and configured to receive a set of analog signals and a refresh signal RS. The set of analog signals includes the analog input signal yin, a feedback signal FS, and a compensation signal CS. The refresh signal RS is a global reset signal that is utilized to reset the sigma-delta ADC 104 after the conversion of the analog input signal Vin to the digital output signal DO. The feed-forward circuit 208 is further configured to generate the set of digital signals, i.e., the first and second digital signals D1 and D2. The feed-forward circuit 208 includes a first adder 214, a loop filter 216, and a quantizer 218.

The first adder 214 has non-inverting and inverting input terminals that are coupled with the analog sensor circuit 102 and the first FIR DAC 210, and configured to receive the analog input signal Vin and the feedback signal FS, respectively. The first adder 214 is further configured to subtract the feedback signal FS from the analog input signal Vin and generate a first analog output signal A1. The first adder 214 further has an output terminal that is configured to output the first analog output signal A1.

The loop filter 216 is coupled with the first adder 214, and configured to receive the first analog output signal A1, the compensation signal CS, and the refresh signal RS, and generate an integrated analog signal IA. It will be understood by a person skilled in the art that the loop filter 216 includes a number of integrators that is equal to the order of the sigma-delta ADC 104. In one example, the order of the sigma-delta ADC 104 is three and the loop filter 216 includes three integrators, i.e., first through third integrators 220a-220c. The loop filter 216 further includes a first gain stage 222 and a second adder 224.

The first integrator 220a is coupled with the first adder 214, and configured to receive the first analog output signal A1 and the refresh signal RS. The first integrator 220a is further configured to integrate the first analog output signal A1 and generate a second analog output signal A2. The first integrator 220a is reset when the refresh signal RS is activated, i.e., generated at logic high state. Thus, the first integrator 220a generates the second analog output signal A2 when the refresh signal RS is deactivated, i.e., generated at logic low state. In one embodiment, to generate the second analog output signal A2, the first integrator 220a integrates the first analog output signal A1 along with a previous integration result performed by the first integrator 220a.

The first gain stage 222 is coupled with the first integrator 220a, and configured to receive the second analog output signal A2 and generate a third analog output signal A3. The third analog output signal A3 may be an amplified version of the second analog output signal A2. The first gain stage 222 may be configured to amplify the second analog output signal A2 by a pre-defined gain value. In one example, the first gain stage 222 is implemented by way of a switched-capacitor element.

The second integrator 220b is coupled with the first integrator 220a, and configured to receive the second analog output signal A2 and the refresh signal RS. The second integrator 220b is further configured to integrate the second analog output signal A2 and generate a fourth analog output signal A4. The second integrator 220b is reset when the refresh signal RS is activated. Thus, the second integrator 220b generates the fourth analog output signal A4 when the refresh signal RS is deactivated. In one embodiment, to generate the fourth analog output signal A4, the second integrator 220b integrates the second analog output signal A2 along with a second value that is stored from a previous integration step executed by the second integrator 220b.

The second adder 224 has a first non-inverting terminal, a second non-inverting terminal, and an inverting terminal that are coupled with the first gain stage 222, the second integrator 220b, and the second FIR DAC 212, respectively. The first and second non-inverting terminals and the inverting terminal of the second integrator 220b are configured to receive the third analog output signal A3, the fourth analog output signal A4, and the compensation signal CS, respectively. The second adder 224 is further configured to add the third and fourth analog output signals A3 and A4, and subtract the compensation signal CS from a result of the addition of the third and fourth analog output signals A3 and A4 to generate a fifth analog output signal A5. The second adder 224 further has an output terminal that is configured to output the fifth analog output signal A5.

The third integrator 220c is coupled with the second adder 224, and configured to receive the fifth analog output signal A5 and the refresh signal RS. The third integrator 220c is further configured to integrate the fifth analog output signal A5 and generate the integrated analog signal IA. The third integrator 220c is reset when the refresh signal RS is activated. Thus, the third integrator 220c generates the integrated analog signal IA when the refresh signal RS is deactivated. In one embodiment, to generate the integrated analog signal IA, the third integrator 220c integrates the fifth analog output signal A5 along with a third value that is stored from a previous integration step executed by the third integrator 220c.

The first through third integrators 220a-220c are analog integrators. The integration performed by each of the first through third integrators 220a-220c is associated with a first transfer function that is represented by an equation (1) given below:

$$TF1 = \frac{z^{-1}}{1 - z^{-1}} \quad (1)$$

where,
TF1 represents the first transfer function, and
z represents a complex number.

The quantizer 218 is a single-bit quantizer that converts an analog signal to two single-bit digital signals such that one single-bit digital signal is an inverted version of the other single-bit digital signal. The quantizer 218 is coupled with the third integrator 220c, and configured to receive the integrated analog signal IA and generate the set of digital signals, i.e., the first and second digital signals D1 and D2. In one embodiment, the quantizer 218 is implemented by utilizing a comparator (not shown) that may be configured to compare the integrated analog signal IA with a pre-defined reference signal (not shown) and generate the set of digital signals. In one example, if the integrated analog signal IA is greater than the pre-defined reference signal, the comparator generates the first digital signal D1 at logic high state and the second digital signal D2 at logic low state. In another example, if the integrated analog signal IA is less than the pre-defined reference signal, the comparator generates the first digital signal D1 at logic low state and the second digital signal D2 at logic high state.

It will be understood by a person skilled in the art that although in the current embodiment, the quantizer 218 converts an analog signal to two single-bit digital signals such that one single-bit digital signal is an inverted version of the other single-bit digital signal, in an alternate embodiment, the quantizer 218 converts an analog signal to generate a single-bit digital signal and utilizes a NOT gate to generate an inverted version of the single-bit digital signal.

The first FIR DAC 210 is a single-bit FIR DAC that is configured to convert single-bit digital signals, i.e., the first and second digital signals D1 and D2, to generate an analog signal, i.e., the feedback signal FS. The first FIR DAC 210 is coupled with the quantizer 218 and the first adder 214, and configured to receive the set of digital signals, a set of reset signals, a set of reference signals, and the clock signal CLK. The set of reference signals includes first and second reference signals Vref1 and Vref2. The first reference signal Vref1 is a non-inverted reference signal, i.e., +Vref, and the second reference signal Vref2 is an inverted reference signal, i.e., −Vref. Thus, the second reference signal Vref2 is an inverted version of the first reference signal Vref1. The first FIR DAC 210 is further configured to generate the feedback signal FS and provide the feedback signal FS to the first adder 214. In one embodiment, when the sigma-delta ADC 104 is a discrete-time sigma-delta. ADC, the first FIR DAC 210 and the loop filter 216 are implemented by utilizing a set of switched-capacitor elements (not shown). In another embodiment, when the sigma-delta ADC 104 is a continuous-time sigma-delta ADC, the first FIR DAC 210 and the loop filter 216 are implemented by utilizing a set of active resistor-capacitor elements (not shown).

The second FIR DAC 212 is a compensation DAC that is configured to convert single-bit digital signals, i.e., the first and second digital signals D1 and D2, to an analog signal, i.e., the compensation signal CS. The compensation signal CS ensures a stability of the loop filter 216. The second FIR DAC 212 is coupled with the quantizer 218 and the second adder 224, and configured to receive the set of digital signals, the set of reset signals, the set of reference signals, and the clock signal CLK. The second FIR DAC 212 is further configured to generate the compensation signal CS and provide the compensation signal CS to the second adder 224.

The control circuit 204 is coupled with the first FIR DAC 210, the second FIR DAC 212, and the first through third integrators 220a-220c. The control circuit 204 is configured to generate the clock signal CLK, the set of reference signals, the refresh signal RS, and the set of reset signals such that each reset signal is deactivated sequentially after each cycle of the clock signal CLK. The control circuit 204 may include a set of signal generators (not shown) that are configured to generate the clock signal CLK, the set of reference signals, the refresh signal RS, and the set of reset signals. The set of reference signals, i.e., the first and second reference signals Vref1 and Vref2 are generated at a predetermined voltage level based on parameters of the sigma-delta ADC 104 such as a dynamic range, a resolution, and the like. The refresh signal RS is the global reset signal. The set of reset signals are generated based on the refresh signal RS such that each reset signal of the set of reset signals is deactivated sequentially after each cycle of the clock signal CLK and when the refresh signal RS is deactivated. The control circuit 204 is further configured to provide the refresh signal RS to the decimation filter 206 and the first through third integrators 220a-220c. The control circuit 204 is further configured to provide the clock signal CLK, the set of reference signals, and the set of reset signals to the first and second FIR DACs 210 and 212.

The decimation filter 206 is coupled with the quantizer 218 and the control circuit 204, and configured to receive the set of digital signals and the refresh signal RS and generate the digital output signal DO. The decimation filter 206 includes a set of digital integrators (not shown) that integrate the set of digital signals to generate the digital output signal DO. The set of digital integrators generates the digital output signal DO when the refresh signal RS is deactivated, i.e., generated at logic low state. The first integrator 220a is reset when the refresh signal RS is activated, i.e., generated at logic high state. In one embodiment, when the order of the sigma-delta ADC 104 is three, the set of digital integrators includes three digital integrators. The integration performed by each digital integrator is associated with a second transfer function that is represented by an equation (2) given below:

$$TF2 = \frac{1}{1 - z^{-1}} \quad (2)$$

where,
TF2 represents the second transfer function, and
z represents a complex number.

Figure 3:
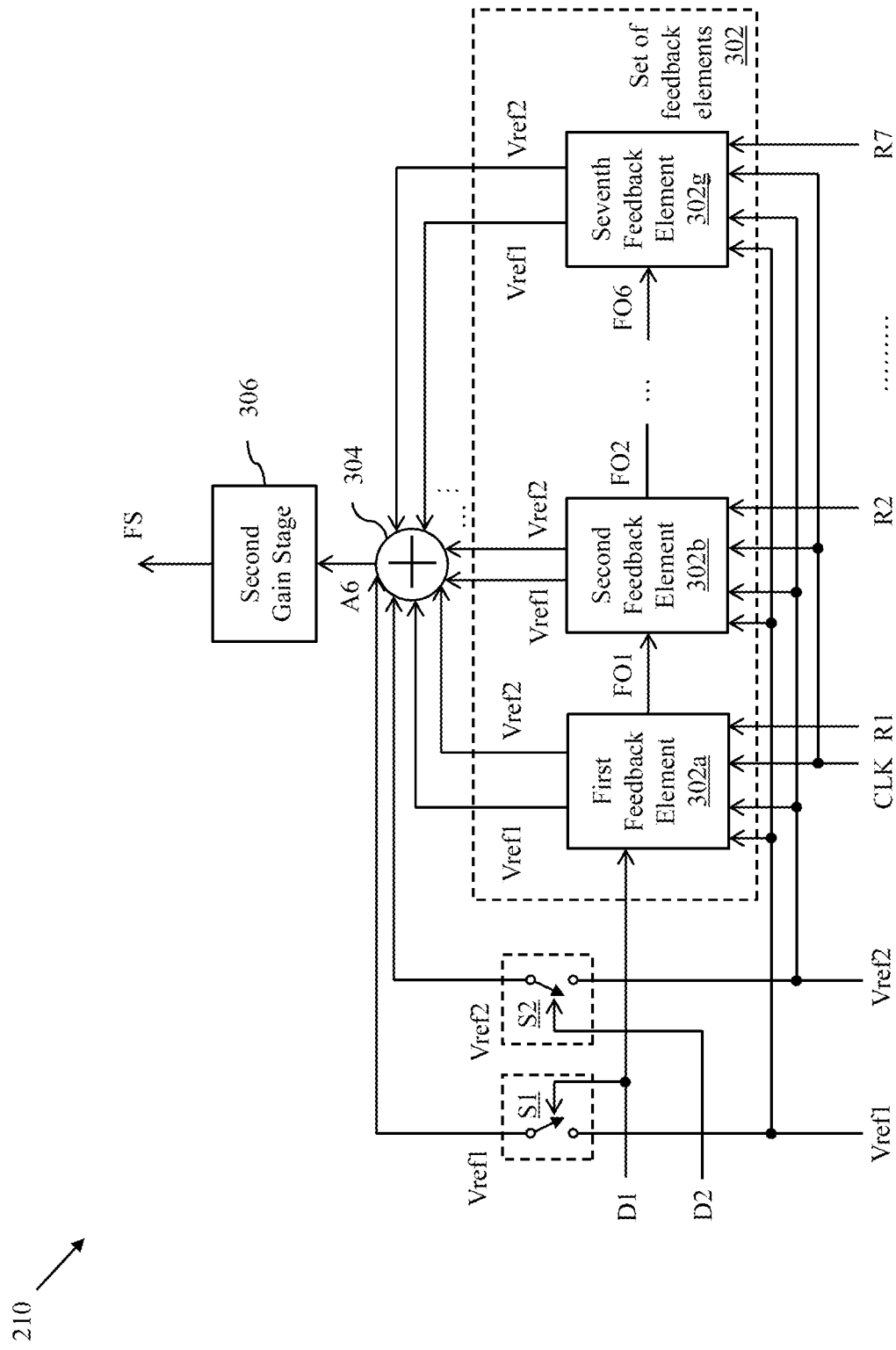
FIG. 3 is a block diagram of a first finite-impulse-response (FIR) digital-to-analog-converter (DAC) of the sigma-delta ADC of FIG. 2 in accordance with an embodiment of the present disclosure.

Referring now to FIG. 3, a block diagram of the first FIR DAC 210 in accordance with an embodiment of the present disclosure is shown. The first FIR DAC 210 is implemented as an 'X' tap FIR filter. In one example, 'X' is eight and the first FIR DAC 210 is implemented as an '8' tap FIR filter. The first FIR DAC 210 includes a first switch S1, a second switch S2, a set of feedback elements 302, a third adder 304, and a second gain stage 306.

The first switch S1 is coupled with the quantizer 218 and the control circuit 204, and configured to receive the first digital signal D1 of the set of digital signals, and the first reference signal Vref1 of the set of reference signals. The first switch S1 is further configured to output the first reference signal Vref1 when the first digital signal D1 is activated, i.e., generated at logic high state.

The second switch S2 is coupled with the quantizer 218 and the control circuit 204, and configured to receive the second digital signal D2 of the set of digital signals, and the second reference signal Vref2 of the set of reference signals. The second switch S2 is further configured to output the second reference signal Vref2 when the second digital signal D2 is activated, i.e., generated at logic high state. It will be apparent to a person skilled in the art that as the second digital signal D2 is an inverted version of the first digital signal D1, the first and second switches S1 and S2 output the first and second reference signals Vref1 and Vref2 one at a time, respectively.

The set of feedback elements 302 includes 'Y' feedback elements. Each feedback element of the set of feedback elements 302 is configured to receive a first input signal, the set of reference signals, and a corresponding reset signal of the set of reset signals such that each reset signal is deactivated sequentially after each cycle of the clock signal CLK. The first input signal is based on the set of digital signals. The first input signal is at least one of the first digital signal D1 of the set of digital signals, and a corresponding flop-output signal of a previous feedback element of the set of feedback elements 302. Each feedback element is further configured to output a corresponding flop-output signal, and a corresponding reference output signal based on the corresponding reset signal. Each feedback element outputs the reference output signal sequentially after each cycle of the clock signal CLK when the corresponding reset signal is deactivated. Further, the feedback signal FS is generated based on the corresponding reference output signal outputted by each feedback element. Thus, each feedback element is configured to provide feedback (i.e., the corresponding reference output signal) sequentially that is utilized for generation of the feedback signal FS sequentially after each cycle of the clock signal CLK. In one embodiment, when the first FIR DAC 210 is an 'X' tap FIR filter, 'Y' is 'X−1'. In one example, the first FIR DAC 210 is an '8' tap FIR filter, 'Y' is thus '8−1', i.e., '7'.

The set of feedback elements 302 includes first through seventh feedback elements 302a, 302b, ..., 302g of which the first, second, and seventh feedback elements 302a, 302b, and 302g are shown. It will be apparent to a person skilled in the art that the third though sixth feedback elements (not shown) are present between the second feedback element 302b and the seventh feedback element 302g. Each of the first through seventh feedback elements 302a, 302b, ..., 302g is configured to receive the clock signal CLK, the first and second reference signals Vref1 and Vref2, a corresponding reset signal, and the first input signal. Further, each of the first through seventh feedback elements 302a, 302b, 302g is configured to output a corresponding reference output signal. Thus, the set of reset signals includes seven reset signals of which first, second, and seventh reset signals R1, R2, and R7 that are utilized to reset the first, second, and seventh feedback elements 302a, 302b, and 302g, are shown. Each reset signal of the set of reset signals is deactivated sequentially after each cycle of the clock signal CLK.

The first feedback element 302a is coupled with the quantizer 218 and the control circuit 204, and configured to receive the first digital signal D1 as the first input signal, the clock signal CLK, the first and second reference signals Vref1 and Vref2 as the set of reference signals, and the first reset signal R1. The first feedback element 302a is further configured to generate and output a first reference output signal, i.e., one of the first reference signal Vref1 and the second reference signal Vref2, and a first flop-output signal FO1. The first feedback element 302a is reset when the first reset signal R1 is activated, i.e., generated at logic high state. The first feedback element 302a continues to be in the reset state, i.e., an open state, until the first reset signal R1 is deactivated, i.e., generated at logic low state. The first feedback element 302a is explained in detail in conjunction with FIG. 4.

The second feedback element 302b is coupled with the first feedback element 302a and the control circuit 204, and configured to receive the first flop-output signal FO1 as the first input signal. The second feedback element 302b is further configured to receive the clock signal CLK, the set of reference signals, and the second reset signal R2. The second feedback element 302b is further configured to generate and output a second reference output signal, i.e., one of the first reference signal Vref1 and the second reference signal Vref2, and a second flop-output signal FO2. The second feedback element 302b is reset when the second reset signal R2 is activated, i.e., generated at logic high state. The second feedback element 302b continues to be in the reset state until the second reset signal R2 is deactivated, i.e., generated at logic low state.

Similarly, the seventh feedback element 302g is coupled with a previous feedback element, i.e., the sixth feedback element, and the control circuit 204, and configured to receive a sixth flop-output signal FO6, i.e., an output of the sixth feedback element, as the first input signal, the clock signal CLK, the set of reference signals, and the seventh reset signal R7. The seventh feedback element 302g is further configured to generate and output a seventh reference output signal, i.e., one of the first reference signal Vref1 and the second reference signal Vref2. The seventh feedback element 302g is reset when the seventh reset signal R7 is activated, i.e., generated at logic high state. The seventh feedback element 302g continues to be in the reset state until the seventh reset signal R7 is deactivated, i.e., generated at logic low state.

The third adder 304 is coupled with the first and second switches S1 and S2 and the set of feedback elements 302, i.e., the first through seventh feedback elements 302a, 302b, . . . , 302g. The third adder 304 is configured to receive the first and second reference signals Vref1 and Vref2 when the first and second switches S1 and S2 are activated, respectively, and the corresponding reference output signal, i.e., the first through seventh reference output signals, from each feedback element. The third through sixth reference output signals are received from the third through sixth feedback elements, respectively. Based on the first and second reference signals Vref1 and Vref2 and the first through seventh reference output signals, the third adder 304 is further configured to generate a sixth analog output signal A6.

The second gain stage 306 is coupled with the third adder 304, and configured to receive the sixth analog output signal A6 and generate the feedback signal FS. The feedback signal FS may be an amplified version of the sixth analog output signal A6. The second gain stage 306 may be configured to amplify the sixth analog output signal A6 by a pre-defined gain value. In one example, the pre-defined gain value is '1/8'. In one example, the second gain stage 306 is implemented by way of a switched-capacitor element.

Figure 4:
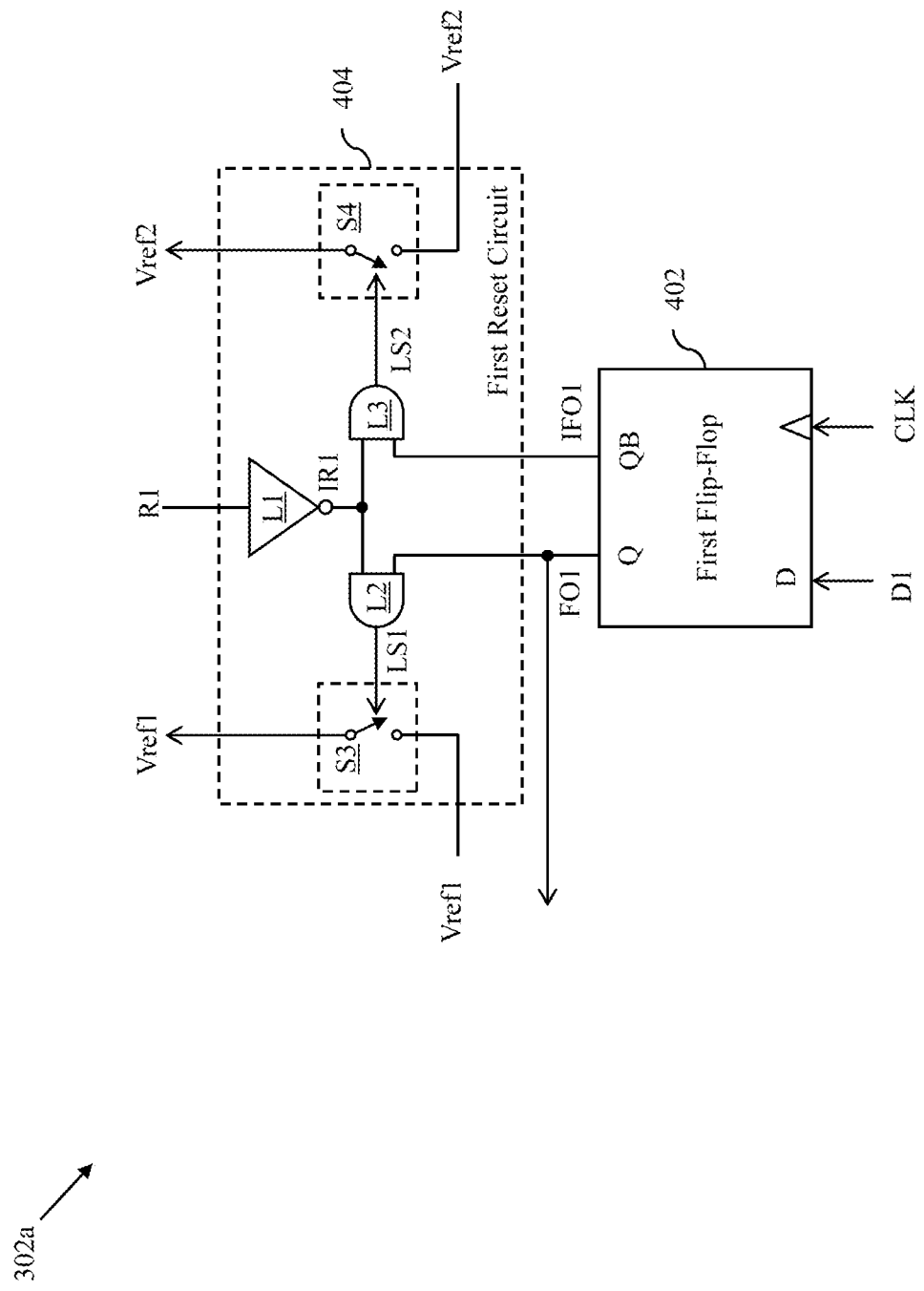
FIG. 4 is a block diagram of a first feedback element of the first FIR DAC of FIG. 3 in accordance with an embodiment of the present disclosure.

Referring now to FIG. 4, a block diagram of the first feedback element 302a in accordance with an embodiment of the present disclosure is shown. The first feedback element 302a includes a first flip-flop 402 and a first reset circuit 404.

The first flip-flop 402 has an input terminal and a clock terminal that are coupled with the quantizer 218 and the control circuit 204, respectively, and configured to receive the first digital signal D1 as the first input signal, and the clock signal CLK, respectively. The first flip-flop 402 is further configured to generate a set of flop-output signals. The set of flop-output signals includes the first flop-output signal FO1 and an inverted first flop-output signal IFO1. The inverted first flop-output signal IFO1 is an inverted version of the first flop-output signal FO1. The first flip-flop 402 further has first and second output terminals that are configured to output the first flop-output signal FO1 and the inverted first flop-output signal IFO1. In an embodiment, the first flip-flop 402 is a D flip-flop.

The first reset circuit 404 is coupled with the first flip-flop 402 and the control circuit 204, and configured to receive the set of flop-output signals, i.e., the first flop-output signal FO1 and the inverted first flop-output signal IFO1, the first and second reference signals Vref1 and Vref2 as the set of reference signals, and a corresponding reset signal, i.e., the first reset signal R1, of the set of reset signals. The first reset circuit 404 is further configured to output the first reference output signal, i.e., one of the first and second reference signals Vref1 and Vref2, when the first reset signal R1 is deactivated. Similarly, second through seventh reset circuits (not shown) of the second through seventh feedback elements 302b, . . . , 302g output the second through seventh reference output signals, respectively, sequentially after each cycle of the clock signal CLK. The first reset circuit 404 includes first through third logic gates L1-L3, and third and fourth switches S3 and S4.

The first logic gate L1 has an input terminal that is coupled with the control circuit 204, and configured to receive the first reset signal R1. The first logic gate L1 generates an inverted first reset signal IR1. The inverted first reset signal IR1 is an inverted version of the first reset signal R1. The first logic gate L1 further has an output terminal that is configured to output the inverted first reset signal IR1. In an example, the first logic gate L1 is a NOT gate.

The second logic gate L2 has first and second input terminals that are coupled with the first output terminal of the first flip-flop 402 and the output terminal of the first logic gate L1, respectively, and configured to receive the first flop-output signal FO1 and the inverted first reset signal IR1, respectively. The second logic gate L2 is configured to generate a first logic signal LS1 based on the first flop-output signal FO1 and the inverted first reset signal IR1, and has an output terminal to output the first logic signal LS1. In an example, the second logic gate L2 is an AND gate.

The third switch S3 is coupled with the output terminal of the second logic gate L2, and the control circuit 204, and configured to receive the first logic signal LS1 and the first reference signal Vref1. The third switch S3 is activated when the first logic signal LS1 is received at logic high state. Thus, the third switch S3 is further configured to output the first reference signal Vref1 as the first reference output signal when the first logic signal LS1 is activated, i.e., generated at logic high state.

The third logic gate L3 has first and second input terminals that are coupled with the second output terminal of the first flip-flop 402 and the output terminal of the first logic gate L1, and configured to receive the inverted first flop-output signal IFO1 and the inverted first reset signal IR1, respectively. The third logic gate L3 is configured to generate a second logic signal LS2 based on the inverted first flop-output signal IFO1 and the inverted first reset signal IR1, and has an output terminal to output the second logic signal LS2. In an example, the third logic gate L3 is an AND gate.

The fourth switch S4 is coupled with the output terminal of the third logic gate L3, and the control circuit 204, and configured to receive the second logic signal LS2 and the second reference signal Vref2. The fourth switch S4 is activated when the second logic signal LS2 is received at logic high state. Thus, the fourth switch S4 is further configured to output the second reference signal Vref2 as the first reference output signal when the second logic signal LS2 is activated, i.e., generated at logic high state. In one example, each of the first through fourth switches S1-S4 is implemented by way of a transmission gate in a differential implementation utilizing both p-channel and n-channel metal oxide semiconductor transistors.

It will be apparent to a person skilled in the art that as the inverted first flop-output signal IFO1 is an inverted version of the first flop-output signal FO1, the third and fourth switches S3 and S4 output the first and second reference signals Vref1 and Vref2 as the first reference output signal one at a time, respectively, when the inverted first reset signal IR1 is at logic high state. It will be further apparent to a person skilled in the art that the second through seventh feedback elements 302b, . . . , 302g are structurally and functionally similar to the first feedback element 302a.

It will be understood by a person skilled in the art that when the first reset signal R1 is at logic high state, the third and fourth switches S3 and S4 remain deactivated and are independent of logic states of the first flop-output signal FO1 and the inverted first flop-output signal IFO1. Thus, the first feedback element 302a does not provide feedback when the first reset signal R1 is at logic high state, i.e., the first feedback element 302a is in the reset state.

Figure 5:
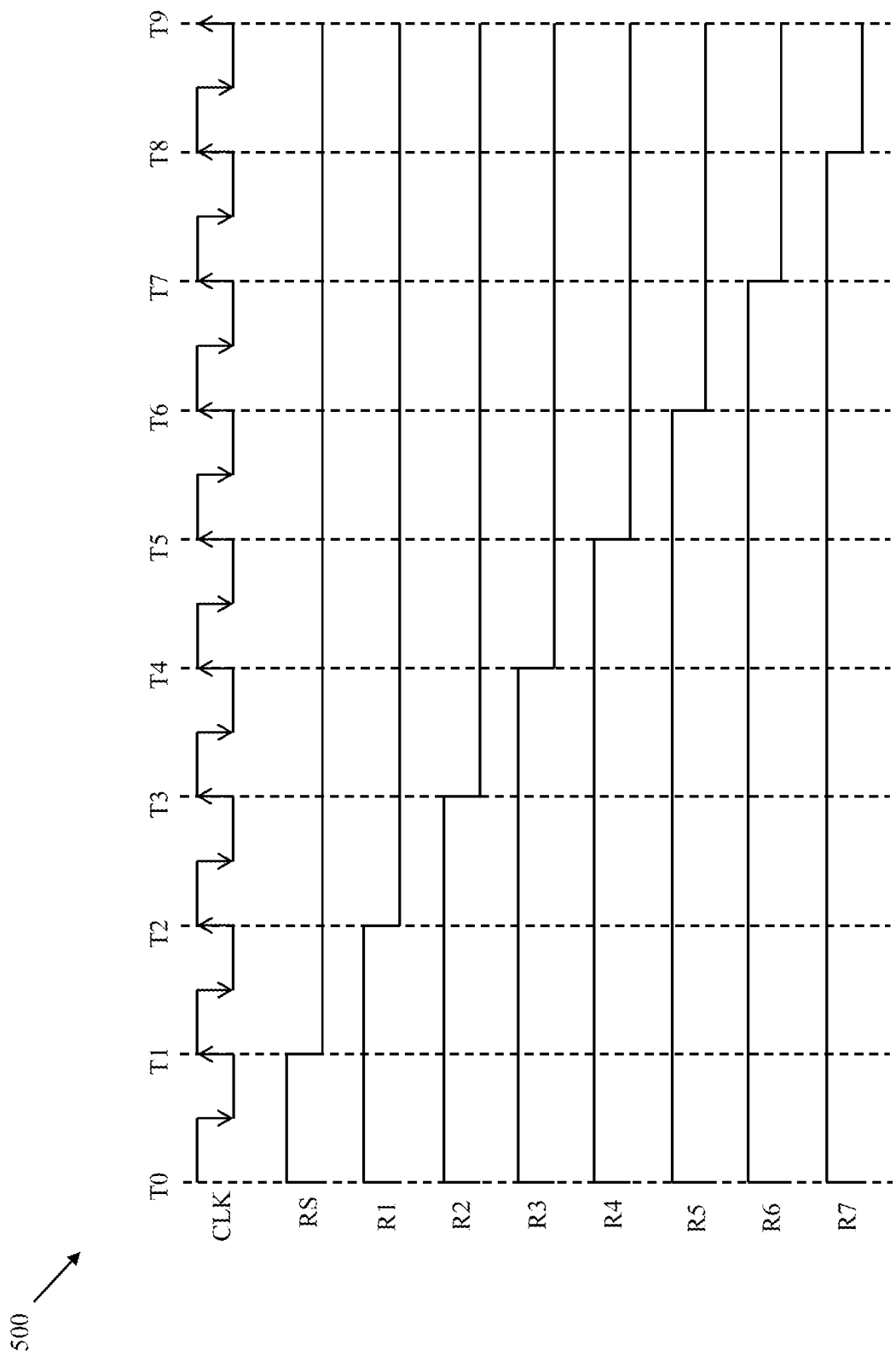
FIG. 5 is a timing diagram that illustrates an operation of the sigma-delta ADC of FIG. 2 in accordance with an embodiment of the present disclosure.

Referring now to FIG. 5, a timing diagram 500 illustrating an operation of the sigma-delta ADC 104 in accordance with an embodiment of the present disclosure is shown.

At time instance T0, i.e., at a start of a first cycle of the clock signal CLK (at a start of the conversion), the refresh signal RS and the set of reset signals, i.e., the first through seventh reset signals R1, R2, . . . , R7, are activated, i.e., generated at logic high state. Thus, the first through third integrators 220a-220c, the first through seventh feedback elements 302a, 302b, . . . , 302g, and the decimation filter 206 are in the reset state. During time period T1-T1, i.e., during the first cycle of the clock signal CLK, the refresh signal RS and the set of reset signals, i.e., the first through seventh reset signals R1, R2, . . . , R7, remain at logic high state. Thus, the first through third integrators 220a-220c, the first through seventh feedback elements 302a, 302b, . . . , 302g, and the decimation filter 206 remain in the reset state.

At time instance T1, i.e., at the end of the first cycle and at a start of a second cycle of the clock signal CLK, the refresh signal RS transitions from logic high state to logic low state, thereby releasing the first through third integrators 220a-220c, and the decimation filter 206 from the reset state to output a corresponding output signal. During time period T1-T2, i.e., during the second cycle of the clock signal CLK, the refresh signal RS remains at logic low state, and the first through seventh reset signals R1, R2, . . . , R7 remain at logic high state. Thus, the first through seventh feedback elements 302a, 302b, . . . , 302g remain in the reset state giving no feedback. The first adder 214 receives the analog input signal Vin and the feedback signal FS, and generates the first analog output signal A1. Further, the feedback signal FS is generated based on at least one of the first and second reference signals Vref1 and Vref2 outputted by at least one of the first and second switches S1 and S2, respectively. The loop filter 216 receives the first analog output signal A1 and generates the integrated analog signal IA. The quantizer 218 receives the integrated analog signal IA and generates the first and second digital signals D1 and D2. Based on the first and second digital signals D1 and D2, the decimation filter 206 generates the digital output signal DO.

At time instance T2, i.e., at the end of the second cycle and a start of a third cycle of the clock signal CLK, the first reset signal R1 transitions from logic high state to logic low state, thereby releasing the first feedback element 302a from the reset state to output the first reference output signal. During time period T2-T3, i.e., during the third cycle of the clock signal CLK, the refresh signal RS and the first reset signal R1 remain at logic low state, and the second through seventh reset signals R2, . . . , R7 remain at logic high state. Thus, the second through seventh feedback elements 302b, . . . , 302g remain in the reset state giving no feedback. The first feedback element 302a receives the first digital signal D1 and generates the first flop-output signal FO1 and the inverted first flop-output signal IFO1. Based on the first flop-output signal FO1, the inverted first flop-output signal IFO1, and the inverted first reset signal IR1, at least one of the first and second reference signals Vref1 and Vref2 is outputted as the first reference output signal by at least one of the third and fourth switches S3 and S4, respectively Further, the feedback signal FS is generated based on at least one of the first and second reference signals Vref1 and Vref2 outputted by at least one of the first and second switches S1 and S2, respectively, and the first reference output signal, i.e., at least one of the first and second reference signals Vref1 and Vref2.

Similarly, at time instances T3-T8, i.e., at an end of third through eighth cycles and at a start of fourth through ninth cycles of the clock signal CLK, respectively, the second through seventh reset signals R2, . . . , R7 transition from logic high state to logic low state, thereby releasing the second through seventh feedback elements 302b, . . . , 302g from the reset state, respectively. Further, during time period T3-T9, i.e., during the fourth through ninth cycles of the clock signal CLK, the second through seventh feedback elements 302b, . . . , 302g start outputting the second through seventh reference output signals at the end of the third through eighth cycles, respectively. Additionally, from time instance T9 onwards, the feedback signal FS is generated based on at least one of the first and second reference signals Vref1 and Vref2 outputted by at least one of the first and second switches S1 and S2, respectively, and the first through seventh reference output signals.

It will be apparent to a person skilled in the art that the sigma-delta ADC 104 converts the analog input signal Vin for 'M' cycles of the clock signal CLK to generate the final digital output signal DO. In one example, the sigma-delta ADC 104 converts the analog input signal Vin for '64' cycles of the clock signal CLK to generate the final digital output signal DO.

Figure 6A:
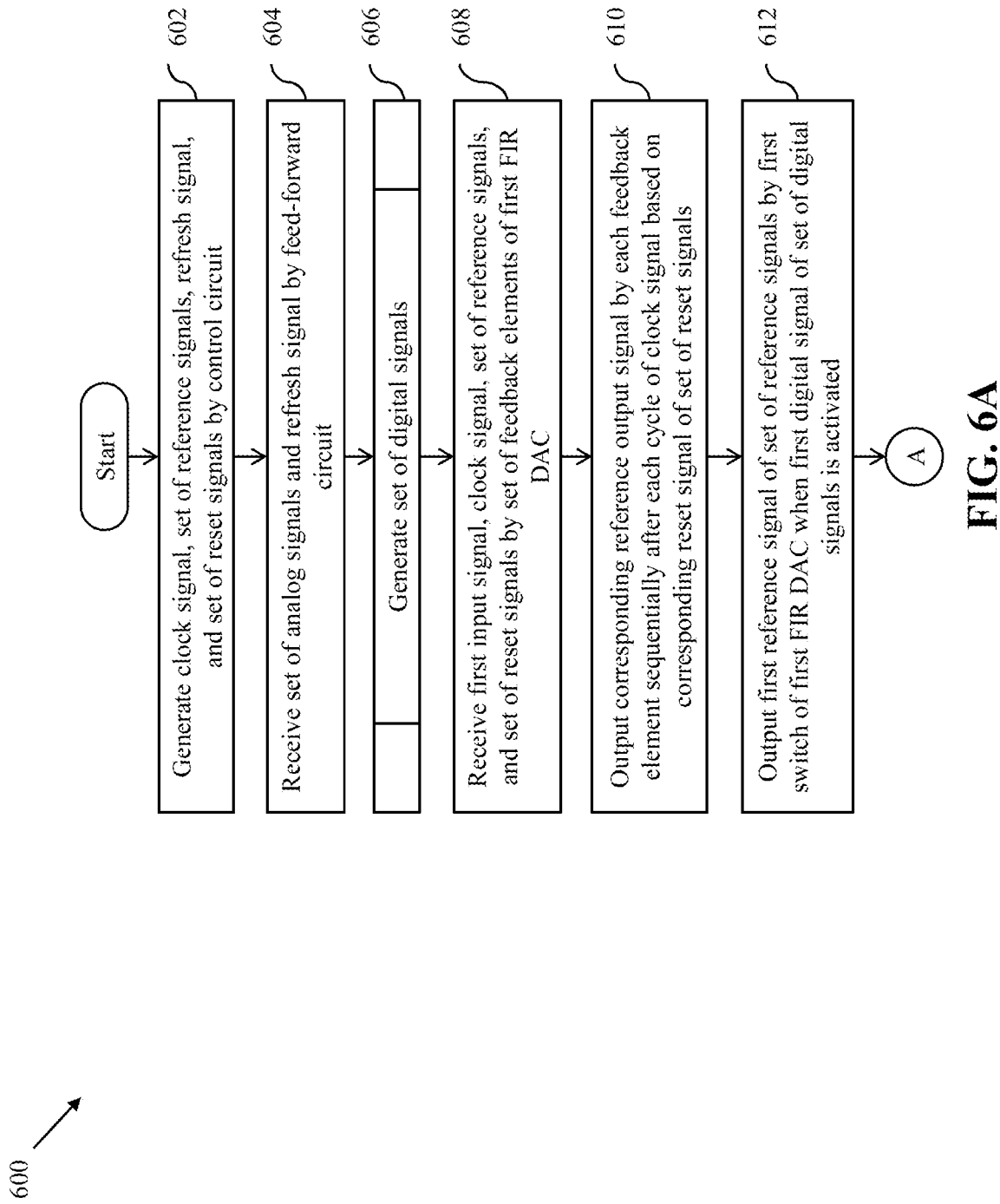
Figure 6B:
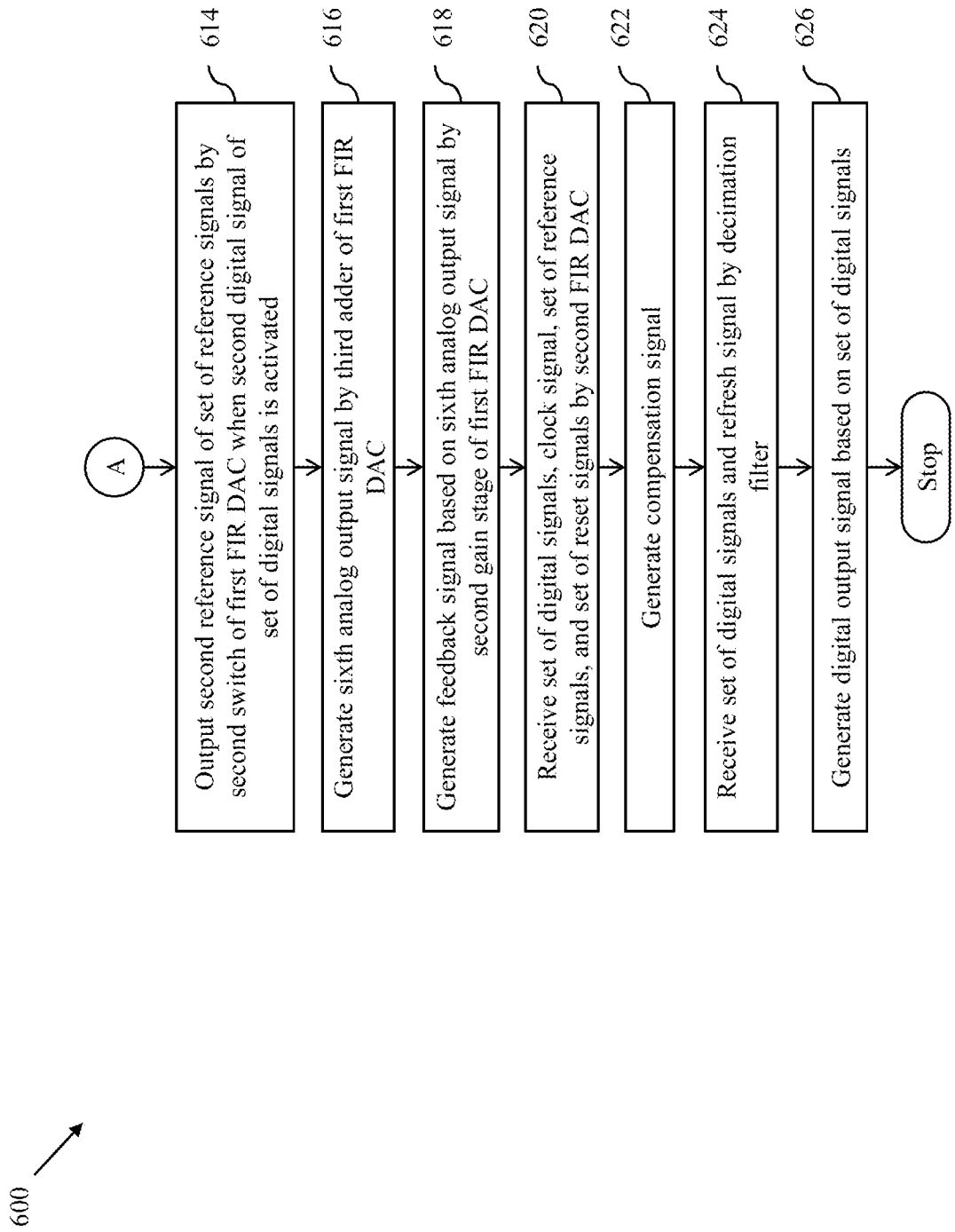

Referring now to FIGS. 6A-6C, a flow chart 600 illustrating a method for generating the digital output signal DO by the sigma-delta ADC 104 in accordance with an embodiment of the present disclosure is shown.

Referring now to FIG. 6A, at step 602, the control circuit 204 generates the clock signal CLK, the set of reference signals, i.e., the first and second reference signals Vref1 and Vref2, the refresh signal RS, and the set of reset signals, i.e., the first through seventh reset signals R1, R2, . . . , R7. At step 604, the feed-forward circuit 208 receives the set of analog signals, i.e., the analog input signal yin, the feedback signal FS, and the compensation signal CS, and the refresh signal RS. At step 606, the feed-forward circuit 208 generates the set of digital signals, i.e., the first and second digital signals D1 and D2.

Referring now to FIG. 6C, at step 606a, the first adder 214 generates the first analog output signal A1 based on the analog input signal Vin and the feedback signal FS. At step 606b, the loop filter 216 integrates the first analog output signal A1 by way of the first through third integrators 220a-220c, the first gain stage 222, and the second adder 224 to generate the integrated analog signal IA. At step 606c, the quantizer 218 converts the integrated analog signal IA to generate the set of digital signals, i.e., the first and second digital signals D1 and D2.

Referring back to FIG. 6A, at step 608, the first FIR DAC 210 receives the first input signal, the clock signal CLK, the set of reference signals, i.e., the first and second reference signals Vref1 and Vref2, and the set of reset signals, i.e., the first through seventh reset signals R1, R2, . . . , R7. The first input signal is at least one of the first digital signal D1 of the set of digital signals, and a corresponding flop-output signal of a previous feedback element of the set of feedback elements 302. At step 610, each feedback element of the set of feedback elements 302 outputs a corresponding reference output signal, such as the first through seventh reference output signals, sequentially after each cycle of the clock signal CLK based on a corresponding reset signal of the set of reset signals. Each feedback element of the set of feedback elements 302 outputs the corresponding reference output signal when the corresponding reset signal is deactivated. At step 612, the first switch S1 of the first FIR DAC 210 outputs the first reference signal Vref1 of the set of reference signals when the first digital signal D1 of the set of digital signals is activated.

Referring now to FIG. 6B, at step 614, the second switch S2 of the first FIR DAC 210 outputs the second reference signal Vref2 of the set of reference signals when the second digital signal D2 of the set of digital signals is activated. At step 616, the third adder 304 of the first FIR DAC 210 generates the sixth analog output signal A6 based on the first and second reference signals Vref1 and Vref2 outputted by the first and second switches S1 and S2 and the corresponding reference output signal outputted by each feedback element.

At step 618, the second gain stage 306 of the first FIR DAC 210 generates the feedback signal FS based on the sixth analog output signal A6. At step 620, the second FIR DAC 212 receives the set of digital signals, the clock signal CLK, the set of reference signals, and the set of reset signals. At step 622, the second FIR DAC 212 generates the compensation signal CS.

At step 624, the decimation filter 206 receives the set of digital signals and the refresh signal RS. At step 626, the decimation filter 206 generates the digital output signal DO based on the set of digital signals, i.e., the first and second digital signals D1 and D2.

The sigma-delta ADC 104 is an incremental sigma-delta ADC and is reset by the refresh signal RS at the start of each conversion. Each feedback element, such as the first feedback element 302a, of the set of feedback elements 302 is reset by a corresponding reset signal, such as the first reset signal R1, of the set of reset signals as compared to a global reset signal, i.e., the refresh signal RS, such that each reset signal is deactivated sequentially after each cycle of the clock signal CLK. Further, each feedback element is hence configured to generate feedback, i.e., a corresponding reference output signal, sequentially after each cycle of the clock signal CLK. As the generation of the reference output signal by each feedback element is sequential, an initial state of a flip-flop, such as the first flip-flop 402 of the first feedback element 302a, does not affect the generation of each reference output signal when the corresponding reset signal is at logic high state. Hence, the generation of the digital output signal DO remains unaffected due the initial state of each flip-flop. As the random values that may be present in the initial state of each flip-flop are prevented from being propagated in the digital output signal DO, a systematic offset in the digital output signal DO is eliminated. Further, the sigma-delta ADC 104 does not require calibration circuitry for eliminating the systematic offset. As the systematic offset in the digital output signal DO is eliminated, a dynamic range and an accuracy of the sigma-delta ADC 104 is improved and a drift in the systematic offset due to variation in temperature is further eliminated. Further, the sigma-delta ADC 104 generates the digital output signal DO after each conversion cycle. Thus, a data rate of the sigma-delta ADC 104 is high as compared to the conventional incremental sigma-delta ADC that implements a chopping technique. As the data rate of the sigma-delta ADC 104 is high, a speed of operation of the sigma-delta ADC 104 is high as compared to conventional sigma-delta ADCs.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A sigma-delta analog-to-digital converter (ADC), comprising:
    a feed-forward circuit that is configured to receive a set of analog signals and a refresh signal, and generate a set of digital signals, wherein the set of analog signals includes an analog input signal and a feedback signal;
    a first finite-impulse-response (FIR) digital-to-analog converter (DAC) that is coupled with the feed-forward circuit, and configured to receive the set of digital signals and a clock signal, and generate the feedback signal, wherein the first FIR DAC comprises a set of feedback elements, and wherein each feedback element comprises:
        a flip-flop that is configured to receive a first input signal and generate a set of flop-output signals, wherein the first input signal is based on the set of digital signals; and
        a reset circuit that is coupled with the flip-flop, and configured to receive a set of reference signals, the set of flop-output signals, and a corresponding reset signal of a set of reset signals, and output a reference output signal based on the corresponding reset signal, wherein the reset circuit of each feedback element outputs the reference output signal sequentially after each cycle of the clock signal, and wherein the feedback signal is generated based on the reference output signal; and
    a decimation filter that is coupled with the feed-forward circuit, and configured to receive the set of digital signals and the refresh signal, and generate a digital output signal.

2. The sigma-delta ADC of claim 1, wherein the feed-forward circuit comprises a first adder that is configured to receive the analog input signal and the feedback signal, and generate a first analog output signal.

3. The sigma-delta ADC of claim 2, wherein the feed-forward circuit further comprises a loop filter that is coupled with the first adder, and configured to receive the first analog output signal, a compensation signal, and the refresh signal, and generate an integrated analog signal, and wherein the set of analog signals further includes the compensation signal.

4. The sigma-delta ADC of claim 3, wherein the loop filter comprises:
    a first integrator that is coupled with the first adder, and configured to receive the first analog output signal and the refresh signal, integrate the first analog output signal, and generate a second analog output signal;

a first gain stage that is coupled with the first integrator, and configured to receive the second analog output signal and generate a third analog output signal;

a second integrator that is coupled with the first integrator, and configured to receive the second analog output signal and the refresh signal, integrate the second analog output signal, and generate a fourth analog output signal;

a second adder that is coupled with the first gain stage and the second integrator, and configured to receive the third analog output signal, the fourth analog output signal, and the compensation signal, and generate a fifth analog output signal; and a third integrator that is coupled with the second adder, and configured to receive the fifth analog output signal and the refresh signal, integrate the fifth analog output signal, and generate the integrated analog signal, wherein the first through third integrators generate the second analog output signal, the fourth analog output signal, and the integrated analog signal, respectively, when the refresh signal is deactivated.

5. The sigma-delta ADC of claim 3, wherein the feed-forward circuit further comprises a quantizer that is coupled with the loop filter, and configured to receive the integrated analog signal and generate the set of digital signals.

6. The sigma-delta ADC of claim 5, further comprising:
a second FIR DAC that is coupled with the quantizer and the loop filter, and configured to receive the set of digital signals, the clock signal, the set of reset signals, and the set of reference signals, and generate the compensation signal; and a control circuit that is coupled with the loop filter, the first FIR DAC, the decimation filter, and the second FIR DAC, and configured to generate the clock signal, the set of reference signals, the refresh signal, and the set of reset signals such that each reset signal is deactivated sequentially after each cycle of the clock signal.

7. The sigma-delta ADC of claim 1, wherein the first FIR DAC further comprises:
a first switch that is coupled with the feed-forward circuit, and configured to receive a first digital signal of the set of digital signals, and a first reference signal of the set of reference signals, and output the first reference signal when the first digital signal is activated, wherein the first digital signal is a single-bit digital signal; and a second switch that is coupled with the feed-forward circuit, and configured to receive a second digital signal of the set of digital signals and a second reference signal of the set of reference signals, and output the second reference signal when the second digital signal is activated, wherein the second digital signal is an inverted version of the first digital signal, and wherein the second digital signal is a single-bit digital signal.

8. The sigma-delta ADC of claim 7, wherein the first FIR DAC further comprises a third adder that is coupled with the first and second switches and the set of feedback elements, and configured to receive the first and second reference signals when the first and second switches are activated, respectively, and the reference output signal from the reset circuit of each feedback element, and generate a sixth analog output signal.

9. The sigma-delta ADC of claim 8, wherein the first FIR DAC further comprises a second gain stage that is coupled with the third adder, and configured to receive the sixth analog output signal and generate the feedback signal.

10. The sigma-delta ADC of claim 1, wherein the first input signal is at least one of a first digital signal of the set of digital signals and a corresponding flop-output signal of a previous feedback element of the set of feedback elements.

11. The sigma-delta ADC of claim 1, wherein the reset circuit comprises:
a first logic gate that is configured to receive the corresponding reset signal and generate an inverted reset signal;

a second logic gate that is coupled with the flip-flop and the first logic gate, and configured to receive a first flop-output signal of the set of flop-output signals and the inverted reset signal and generate a first logic signal;

a third switch that is coupled with the second logic gate, and configured to receive the first logic signal and a first reference signal of the set of reference signals, and output the first reference signal as the reference output signal when the first logic signal is activated;

a third logic gate that is coupled with the flip-flop and the first logic gate, and configured to receive a second flop-output signal of the set of flop-output signals and the inverted reset signal and generate a second logic signal, wherein the second flop-output signal is an inverted version of the first flop-output signal; and a fourth switch that is coupled with the third logic gate, and configured to receive the second logic signal and a second reference signal of the set of reference signals, and output the second reference signal as the reference output signal when the second logic signal is activated.

12. The sigma-delta ADC of claim 1, wherein the set of reset signals includes first through Nth reset signals, and wherein the refresh signal and the set of reset signals are activated at a start of a first cycle of the clock signal, the refresh signal is deactivated at an end of the first cycle, and the first through Nth reset signals are deactivated at an end of second through (N+1)th cycles of the clock signal, respectively.

13. The sigma-delta ADC of claim 1, wherein the first FIR DAC is a single-bit FIR DAC, and wherein the digital output signal is a multi-bit digital signal.

14. The sigma-delta ADC of claim 1, wherein the sigma-delta ADC is an incremental sigma-delta ADC, and wherein an order of the sigma-delta ADC is at least three.

15. A method of generating a digital output signal by a sigma-delta analog-to-digital converter (ADC), the method comprising:
receiving, by a feed-forward circuit of the sigma-delta ADC, a set of analog signals and a refresh signal, wherein the set of analog signals includes an analog input signal and a feedback signal;

generating, by the feed-forward circuit, a set of digital signals;

receiving, by a set of feedback elements of a finite-impulse-response (FIR) digital-to-analog converter (DAC) of the sigma-delta ADC, a first input signal, a clock signal, a set of reference signals, and a set of reset signals, wherein the first input signal is based on the set of digital signals;

outputting, by each feedback element, a reference output signal sequentially after each cycle of the clock signal based on a corresponding reset signal of the set of reset signals, wherein the reference output signal is at least one of first and second reference signals of the set of reference signals, and wherein the feedback signal is generated based on the reference output signal;

receiving, by a decimation filter of the sigma-delta ADC, the set of digital signals and the refresh signal; and generating, by the decimation filter, the digital output signal based on the set of digital signals.

16. The method of claim 15, wherein the step of generating the set of digital signals by the feed-forward circuit further comprises:

generating, by a first adder of the feed-forward circuit, a first analog output signal based on the analog input signal and the feedback signal, wherein the set of analog signals further includes the analog input signal;

integrating, by a loop filter of the feed-forward circuit, the first analog output signal to generate an integrated analog signal; and converting, by a quantizer of the feed-forward circuit, the integrated analog signal to generate the set of digital signals.

17. The method of claim 15, further comprising:

outputting, by a first switch of the FIR DAC, the first reference signal when a first digital signal of the set of digital signals is activated, wherein the first digital signal is a single-bit digital signal;

outputting, by a second switch of the FIR DAC, the second reference signal when a second digital signal of the set of digital signals is activated, wherein the second digital signal is an inverted version of the first digital signal, and wherein the second digital signal is a single-bit digital signal;

generating, by a second adder of the FIR DAC, a second analog output signal based on the first and second reference signals outputted by the first and second switches and the reference output signal outputted by each feedback element; and generating, by a gain stage of the FIR DAC, the feedback signal based on the second analog output signal.

18. The method of claim 15, wherein the digital output signal is a multi-bit digital signal, and wherein an order of the sigma-delta ADC is at least three.

19. The method of claim 15, wherein the first input signal is at least one of a flop-output signal of a previous feedback element of the set of feedback elements and a first digital signal of the set of digital signals.

20. The method of claim 15, comprising generating the clock signal, the set of reference signals, the refresh signal, and the set of reset signals by a control circuit of the sigma-delta ADC, wherein each reset signal is deactivated sequentially after each cycle of the clock signal.

* * * * *